United States Patent [19]

Huang

[11] Patent Number: 5,155,747
[45] Date of Patent: Oct. 13, 1992

[54] ANTI-FRAUD MEANS FOR DIGITAL MEASURING INSTRUMENT

[76] Inventor: Chung-Hwa Huang, c/o Hung Hsing Patent Service Center P. O. Box 55-1670, Taipei (10477), Taiwan

[21] Appl. No.: 672,445

[22] Filed: Mar. 20, 1991

[51] Int. Cl.$^5$ .............................................. G07B 13/10
[52] U.S. Cl. ........................................ 377/16; 377/14; 377/30; 377/39; 377/20; 364/467
[58] Field of Search ........................ 377/14, 15, 16, 20, 377/30, 39

[56] References Cited

U.S. PATENT DOCUMENTS

| | | | |
|---|---|---|---|
| 3,860,802 | 1/1975 | Knothe et al. | 377/30 |
| 4,128,756 | 12/1978 | Nagano et al. | 377/39 |
| 4,217,484 | 8/1980 | Gerst | 377/30 |
| 4,326,256 | 4/1982 | Furumoto | 377/39 |
| 4,389,563 | 6/1983 | Ricard | 377/20 |
| 4,439,764 | 3/1984 | York et al. | 377/39 |
| 4,573,174 | 2/1986 | Crowley et al. | 377/30 |

Primary Examiner—John S. Heyman

[57] ABSTRACT

An anti-fraud device for digital measuring instrument includes a sensing encoder integrated circuit combinably packed with a sensor, and a measuring decoder integrated circuit combinably packed with a measuring meter for receiving signal as sensed from the sensor through a transmission line. When an external-signal generator is fraudulently installed on the transmission line for increasing output signals into the meter for cheating a meter fare, an external signal from the external-signal generator will be first checked by the measuring decoder integrated circuit provided before the measuring meter to be different from a prestored data in the measuring. Then the measuring decoder will not output a valid pulse to be counted in the measuring meter, without increasing an unwanted meter fare or fees for preventing a fraud matter.

1 Claim, 7 Drawing Sheets

ANTI-FRAUD MEANS FOR DIGITAL MEASURING INSTRUMENT

BACKGROUND OF THE INVENTION

A conventional digital measuring meter, for example, a taximeter, a gas filling meter, a weighing mechine or other such rental equipment with an automatic timing base, generally includes a sensor for detecting signals from a sensing element when performing measurement operation, and, a counter for receiving, counting and converting the sensed signals into fare or charge value displayed on the meter. As shown in prior art FIGS. 1 and 2, a conventional measuring meter M will receive the signals transmitted from the sensor S. A pulse signal of square wave is transmitted from an output terminal S1 of the sensor S through a transmission line T, to be received by an input terminal M1 of the measuring meter M. Even the sensor S and the meter M are respectively protected by well-sealed packing cases S2, M2, someone may install an external signal generator E on the transmission line T between the sensor S and the meter M trying to intentionally increase the signals to be received by the meter as additionally supplied by the generator E in order to illegally earn a dishonest fare or charge from the fraud meter.

The inventor has found such a fraud provoking defect in conventional digital measuring meters to be present, and has invented the present anti-fraud means to prevent the cheating of meter fares.

SUMMARY OF THE INVENTION

The object of the present invention is to an anti-fraud device for a digital measuring instrument including a sensing encoder integrated circuit packaged in combination with a sensor, and a measuring decoder integrated circuit packaged in combination with a measuring meter for receiving a signal sensed from the sensor through a transmission line, in which the measuring decoder integrated circuit will identify an external signal produced from an external-signal generator, which is fraudulently installed on the transmission line between the sensing encoder integrated circuit and the measuring decoder integrated circuit trying to increase output signals into the measuring meter for cheating a meter fare, and the measuring decoder integrated circuit will then operatively preclude an output of a valid pulse to be counted in the measuring meter to thereby prevent a tampered meter of fraudulently increasing unwanted meter fare or fees

DETAILED DESCRIPTION

Figure 1:
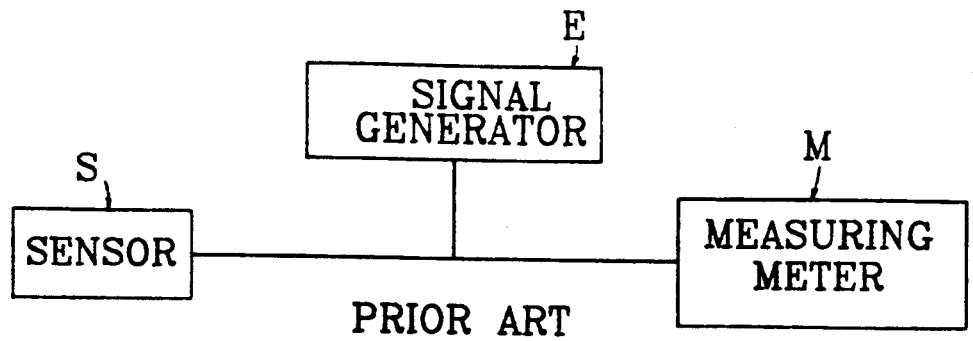
FIG. 1 is an illustation showing a conventional measuring meter.
Figure 2:
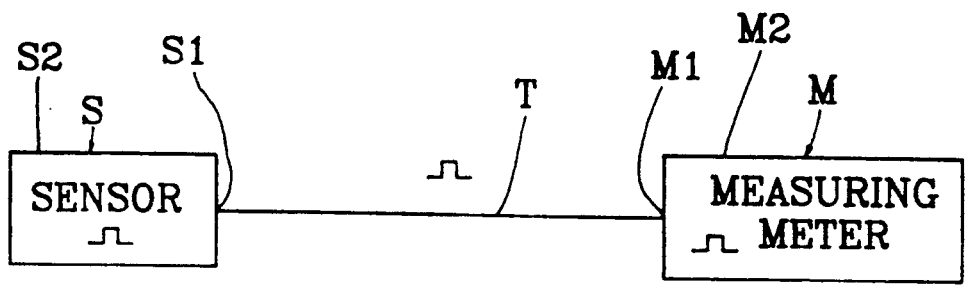
FIG. 2 shows a signal transmission by the measuring meter as shown in FIG. 1.
Figure 3:
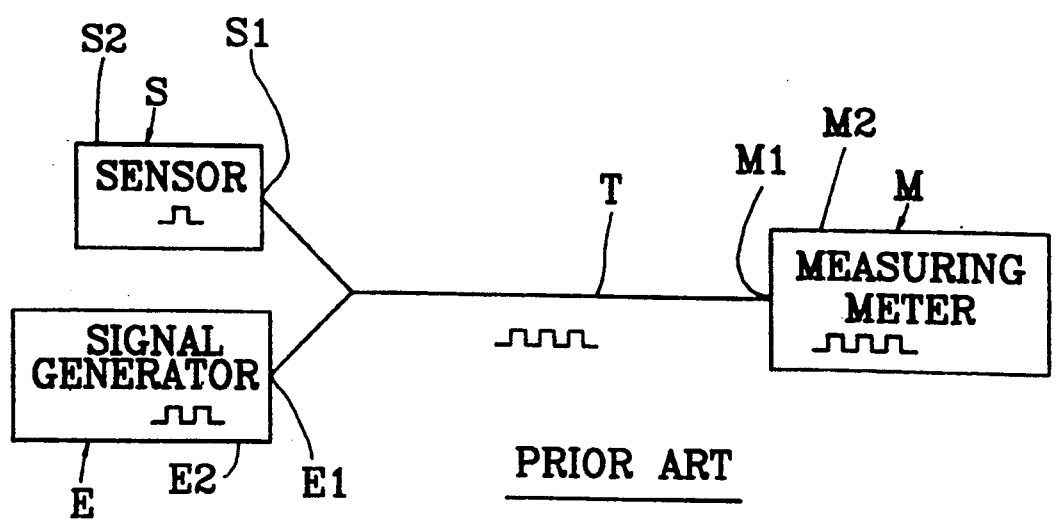
FIG. 3 shows an external-signal generator added in the conventional measuring meter as shown in FIG. 1.

As shown in FIGS. 4-10, an anti-fraud means for a digital measuring instrument of the present invention comprises: a sensor 1 for detecting an input pulse signal responsive to a sensing element of the measuring meter 2, a main body of a digital measuring meter 2 for receiving a preset data signal transmitted from the sensor 1 and for counting and converting the received data signal to be a meter fare or charge value displayed on the meter, a sensing encoder integrated circuit 5 (hereinafter abbreviated as "SEIC") connected to an output 11 of the sensor 1 and sealably packed in a sensor casing 10 commonly encasing the sensor 1 and the SEIC 5 therein, a measuring decoder integrated circuit 6 (hereinafter abbreviated as "MDIC") connected to an input 21 of the main body 2 of the measuring meter and sealably combined with the body 2 in a meter casing 20, and a transmission line 4 connected between the SEIC 5 and the MDIC 6.

The sensing encoder integrated circuit (SEIC) 5 operatively cooperates with the measuring decoder integrated circuit (MDIC) 6, each integrated circuit being one chip designed for customer's exclusive use. The SEIC 5 may be given with a number of TK 6081, whereas the MDIC 6 may be given with a number of TK 6082, for instance.

Figure 7:
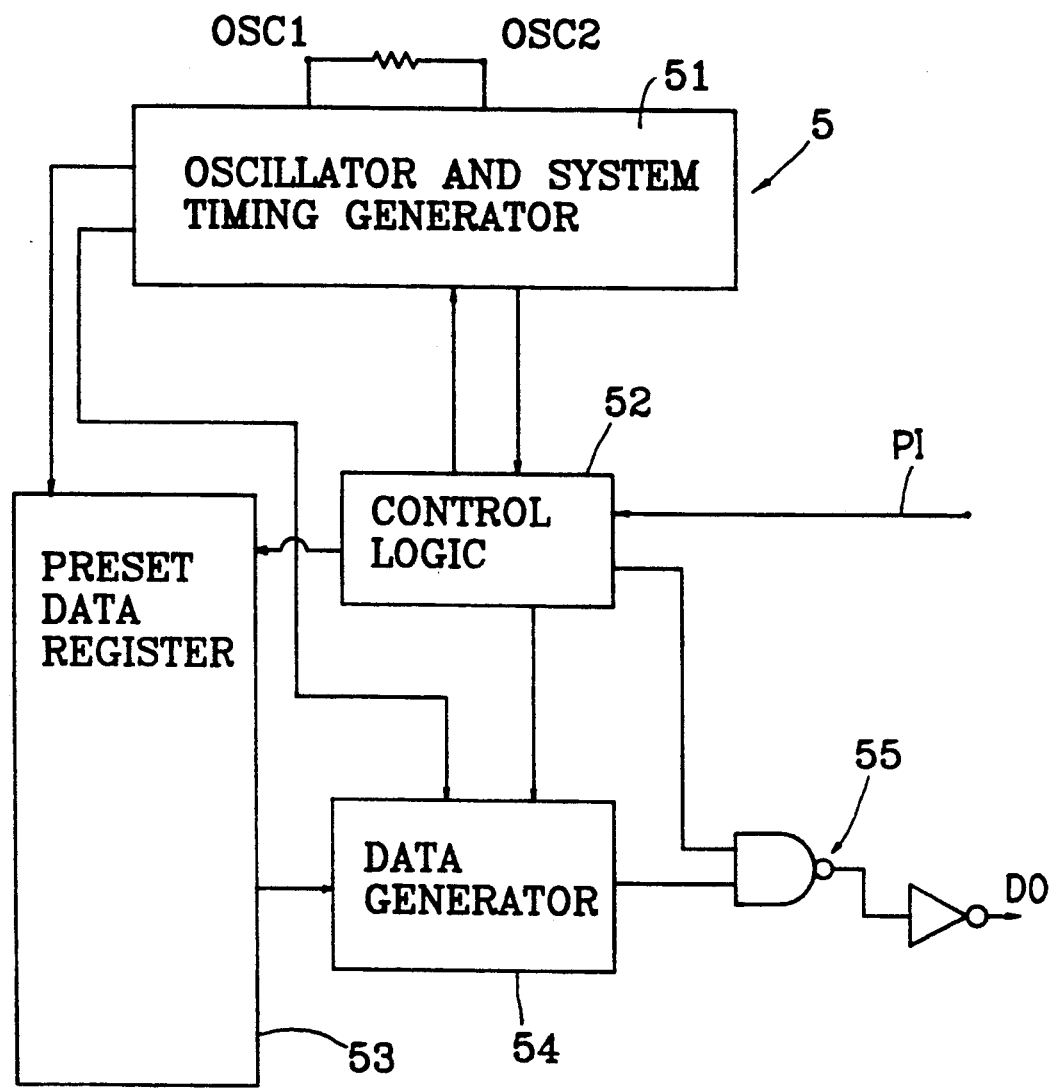
FIG. 7 is a block diagram of the sensing encoder integrated circuit of the present invention.
Figure 8:
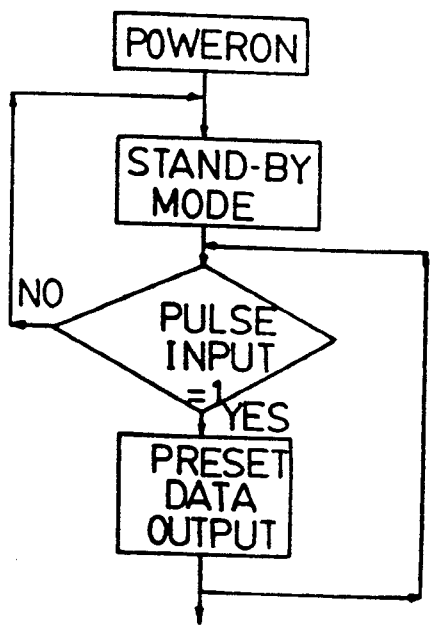
FIG. 8 shows an operation flow chart of the sensing encoder integrated circuit of the present invention.

The sensing encoder integrated circuit 5 as shown in FIGS. 7, 8 includes: an oscillator and system timing generator 51 for producing timing pulses which are distributed from a signal input to various outputs at different times for use in the encoder IC 5, a control logic 52 for controlling data of timing pulses from the generator 51 for entering a register and for receiving and a responding to an input pulse signal through a pulse input pin PI, preset data register 53 for temporarily holding a preset data of the timing pulses therein, a data generator 54 for generating output data signal as controlled by the control logic 52, and a gate 55 for converting two inputs from the data generator 54 and the control logic 52 for outputing a preset data signal through a data output pin DO of the encoder IC 5. The SEIC 5 includes a VDD pin connected with a positive supply of a power source and a Vss pin for connecting a negative supply of the power source.

Figure 10:
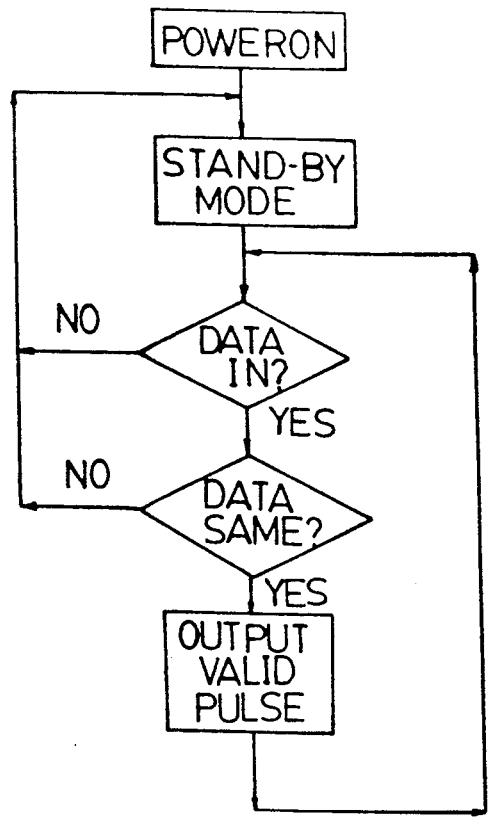
FIG. 10 shows an operation flow chart of the measuring decoder integrated circuit of the present invention.
Figure 9:
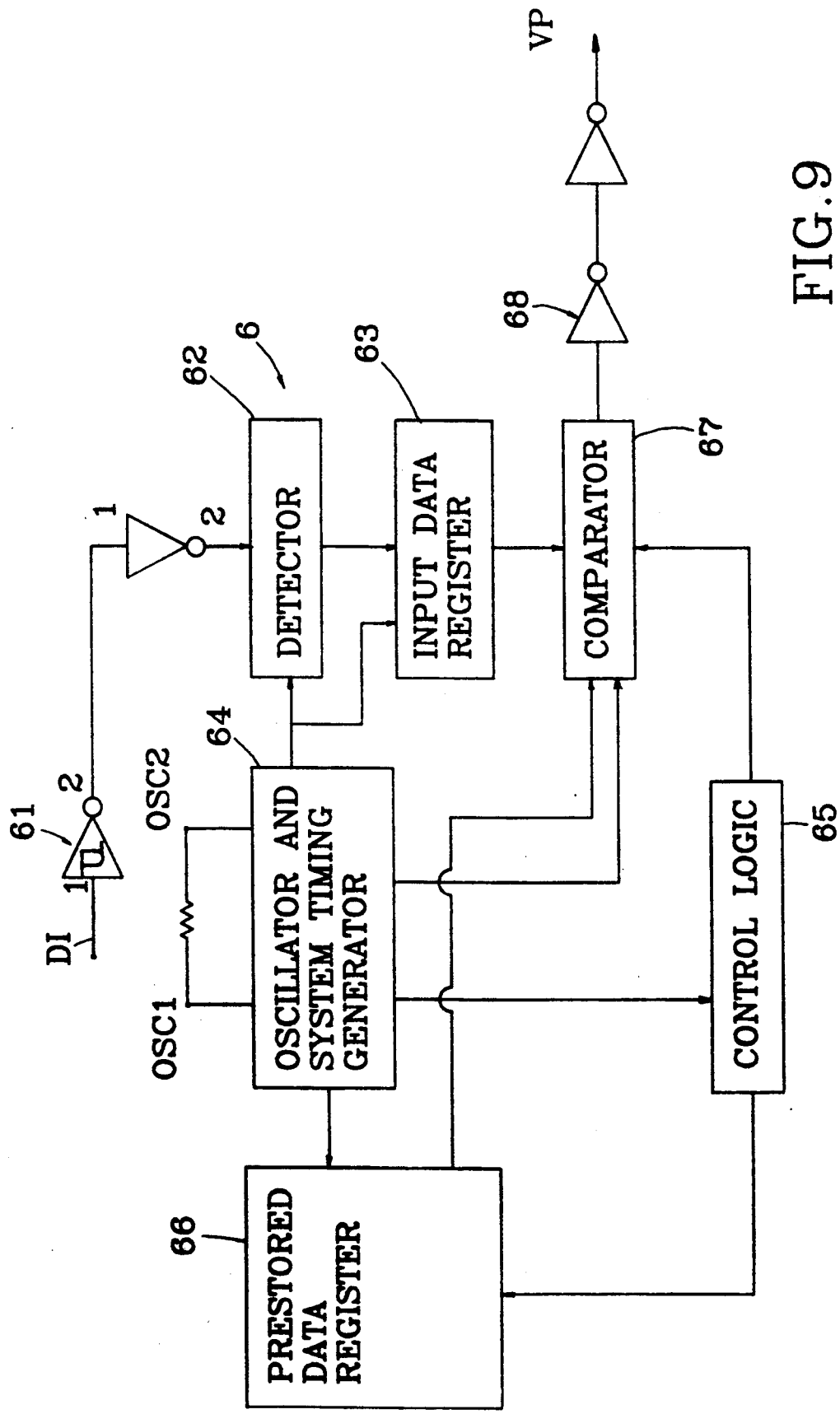
FIG. 9 is a block diagram of the measuring decoder integrated circuit of the present invention.

The measuring decoder integrated circuit (MDIC) 6 as shown in FIGS. 9, 10 includes: a trigger circuit 61 such as a Schmmit trigger for triggering a circuit of the decoder IC 6 when receiving data signal output from the SEIC 5, a data detector 62 connected with the trigger circuit 61 for detecting the data signal output from the SEIC 5, an input data register 63 for temporarily holding an input data from the data signal sensed from the detector 62, an oscillator and system timing generator 64 for producing timing pulses and distributing the pulses for use in the decoder IC 6, a control logic 65 for controlling data of timing pulses from the generator 64 enterring prestored data register 66, the prestored data register 66 temporarily holding a prestored data which prestored data is the same as the preset data preset in the SEIC 5, a comparator 67 for comparing the input data from the input data register 63 with the prestored data from the prestored data register 66 as controlled by the control logic 65, and a gate 68 for outputting a valid pulse from the comparator 67 through a valid pulse pin VP. The MDIC 6 includes a VDD pin connected with a positive supply of a power soyrce and a Vss pin for connecting a negative supply of the power source.

Figure 5:
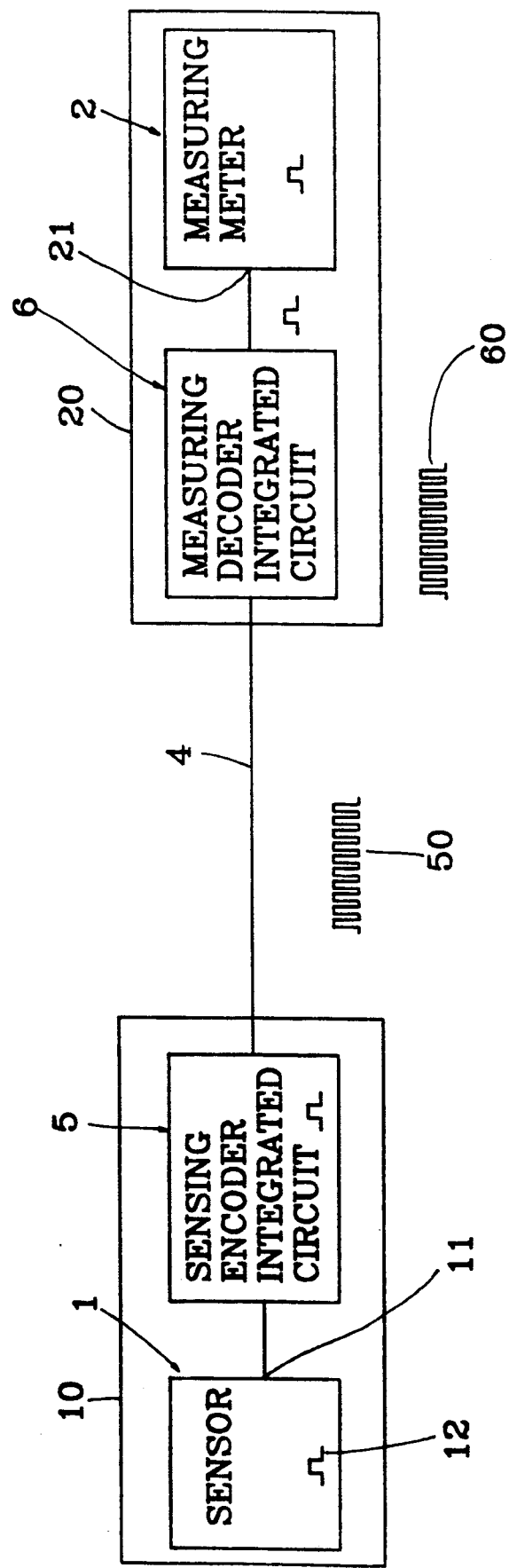
FIG. 5 shows a normal siganl transmission of the present invention.

When using the present invention for normal signal transmission as shown in FIG. 5, an input signal 12 outputted from the sensor 1 is inputted to SEIC 5 for actuating the control logic 52 as shown in FIG. 7 for controlling the data generator 54 for outputting a preset pulse signal 50 preset in SEIC 5, which pulse siganl is then received by the data detector 62 of the MDIC as shown in FIG. 9 to be compared in the comparator 67 of MDIC 6 with a prestored data 60 prestored in MDIC 6. In normal transmission without providing a fraud preventing external-signal generator 3, the preset data from SEIC 5 is same as the prestored data in MDIC 6 so that after being compared in the comparator 67, a valid pulse will be output from MDIC 6 to drive the measuring meter 2 through input 21 to calculate a fare or charge value of the meter 2.

Figure 4:
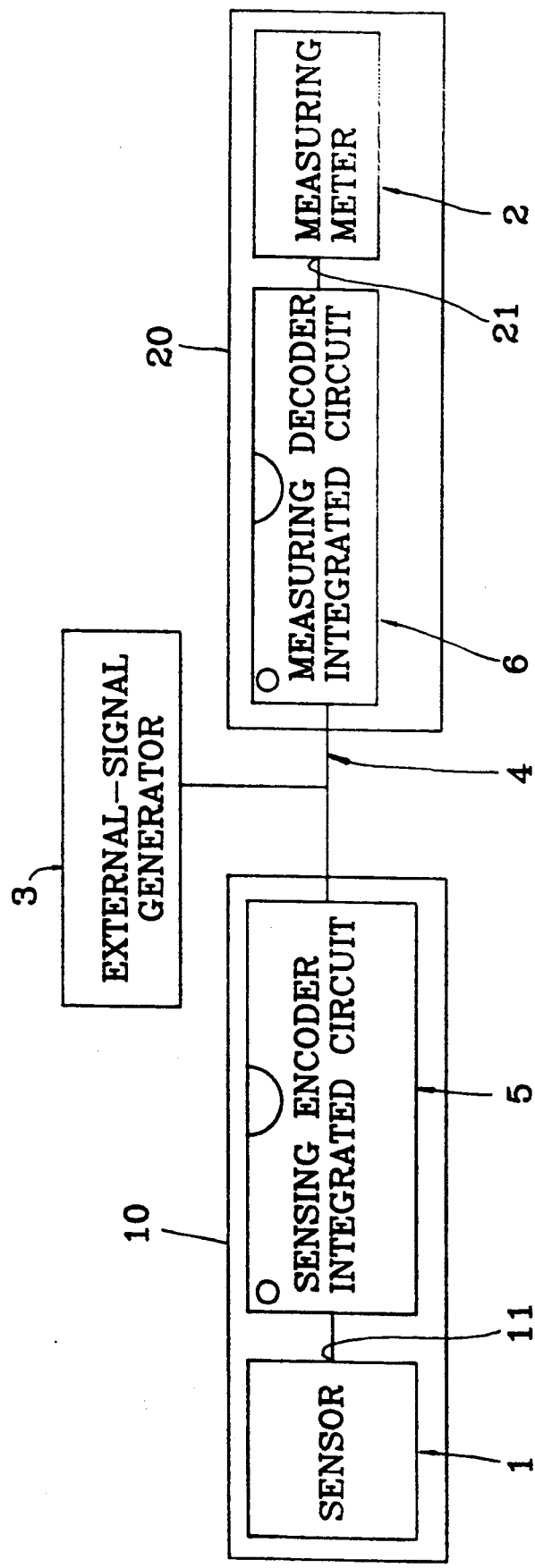
FIG. 4 shows a systematic diagram in accordance with the present invention.
Figure 6:
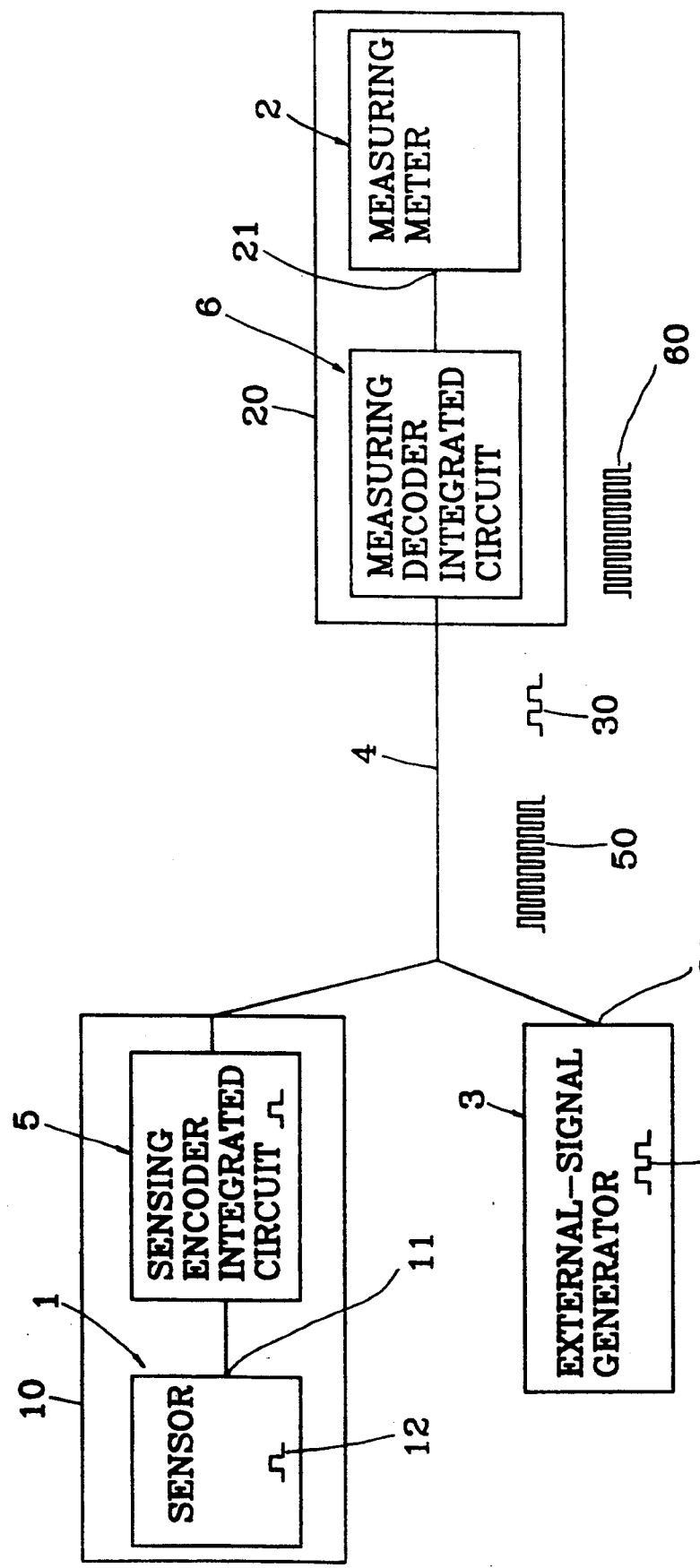
FIG. 6 shows an abnormal signal transmission by the present invention.

If a fraud preventing external-signal generator 3 is added in the transmission line 4 between the sensor 1 and the meter 2 as shown in FIGS. 4, 6, an additional signal 30 from an output 31 of the external-signal generator 3 will be added into the preset signal 50 to from a combined signal which is then received in the MDIC 6 to be compared with the prestored data 60 prestored in MDIC 6. Since the combined signals 50, 30 are different from the prestored data 60, the MDIC 6 will not output a valid pulse and the measuring meter 2 will not receive a valid pulse, thereby preventing a fraudulent act caused by a dishonest meter owner.

In FIG. 8, an operation flow chart of the SEIC 5 is shown in which, when the IC 5 is started with "POWER ON", a standby mode is always operated ready for receiving input pulse. If the input pulse is received (Pulse Input=1), a preset is output (YES). If no input pulse is received (No), the IC will preform its routine standby operation.

As shown in FIG. 10, the MDIC 6 will perform its operation after being started (Power On). The standby mode when receiving the input data (YES) and the input data being the same as the data prestored in the IC 6 (YES), a valid pulse will be output to drive the meter 2. If no data input (No) or the input data is different from the prestored data (No), the IC 6 will perform its routine standby operation.

I claim:

1. An anti-fraud means for digital measuring instrument comprising:

a sensor detecting an input signal responsive to a sensing element of a digital measuring meter;

a sensing encoder integrated circuit connected to an output of said sensor, said sensing encoder integrated circuit including: a first oscillator and system timing generator for producing timing pulses for use in the sensing encoder integrated circuit, a control logic for controlling the timing pulses from the first timing generator into a preset data register and for responding an input pulse signal sensed from said sensor, a data generator for generating output data signal as controlled by said control logic, and a first gate for outputting a preset data signal from said generator;

a measuring integrated circuit operatively cooperating with said sensing encoder integrated circuit by a transmission line connected therebetween, said measuring decoder integrated circuit including: a trigger circuit connected with a data detector for detecting the preset data signal transmitted from said sensing encoder integrated circuit, an input data register for temporarily holding an input data from the data signal sensed from the detector, a second oscillator and system timing generator for producing timing pulses which are prestored in a prestored data register, a comparator operatively comparing the preset data from said input data register and the prestored data from said prestored data register as controlled by a second control logic for producing a valid pulse from said comparator, and a second gate for outputting the valid pulse to the main body of the measuring meter for counting a meter fare;

said measuring decoder integrated circuit sealably combined with said main body of said measuring decoder integrated circuit in a meter casing; and said sensing encoder integrated circuit sealably combined with said sensor in a sensor casing;

said anti-fraud means further including an external-signal generator means installed on said transmission line for increasing fraud data signals into said measuring decoder integrated circuit, said measuring decoder integrated circuit operatively checks for the presence of preset data from said sensing encoder integrated circuit combined with the fraud data signals from said external-signal generator to thus indicate a different signal from said prestored data in said measuring decoder integrated circuit thereby preventing an output of a valid pulse to the measuring meter and preventing a fraudulent meter fare.

* * * * *